United States Patent
Heidelberger et al.

(10) Patent No.: US 9,865,520 B2
(45) Date of Patent: Jan. 9, 2018

(54) TUNABLE SEMICONDUCTOR BAND GAP REDUCTION BY STRAINED SIDEWALL PASSIVATION

(71) Applicant: INTERNATIONAL BUSINESS MACHINES CORPORATION, Armonk, NY (US)

(72) Inventors: Christopher Heidelberger, Cambridge, MA (US); Jeehwan Kim, Los Angeles, CA (US); Ning Li, White Plains, NY (US); Wencong Liu, Shandong (CN); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/821,271

(22) Filed: Aug. 7, 2015

(65) Prior Publication Data
US 2017/0040240 A1 Feb. 9, 2017

(51) Int. Cl.
*H01S 5/22* (2006.01)
*H01L 23/31* (2006.01)
*H01S 5/028* (2006.01)
*H01L 29/06* (2006.01)

(52) U.S. Cl.
CPC ...... *H01L 23/3171* (2013.01); *H01L 29/0657* (2013.01); *H01S 5/0282* (2013.01); *H01S 5/22* (2013.01)

(58) Field of Classification Search
CPC ........ H01S 5/0282; H01S 5/22; H01S 5/3201; H01S 5/3218; H01S 5/3403
See application file for complete search history.

(56) References Cited

U.S. PATENT DOCUMENTS

| 5,780,867 | A | 7/1998 | Fritz et al. |
|---|---|---|---|
| 6,461,884 | B1 | 10/2002 | Razeghi |
| 6,546,034 | B2 | 4/2003 | Komori et al. |
| 8,482,027 | B2 | 7/2013 | Seo et al. |
| 8,731,017 | B2 | 5/2014 | Clifton et al. |
| 8,937,332 | B2 | 1/2015 | Kundaliya et al. |
| 9,036,672 | B2 | 5/2015 | Clifton et al. |

(Continued)

FOREIGN PATENT DOCUMENTS

| JP | 10163574 A | 6/1998 |
|---|---|---|
| WO | WO2011044226 A2 | 4/2011 |

(Continued)

OTHER PUBLICATIONS

Signorello, G., et al., "Tuning the Light Emission from GaAs Nanowires over 290 meV with Uniaxial Strain," Nano Letters, vol. 13, No. 3, Mar. 2013. (pp. 1-8).

(Continued)

*Primary Examiner* — Michael Carter
(74) *Attorney, Agent, or Firm* — Tutunjian & Bitetto, P.C.; Louis J. Percello

(57) ABSTRACT

A semiconductor device includes a mesa structure having vertical sidewalls, the mesa structure including an active area comprising a portion of its height. A stressed passivation liner is formed on the vertical sidewalls of the mesa structure and over the portion of the active area. The stressed passivation liner induces strain in the active area to permit tuning of performance parameters of the mesa structure.

13 Claims, 3 Drawing Sheets

(56) References Cited

U.S. PATENT DOCUMENTS

| | | | |
|---|---|---|---|
| 9,041,080 B2 | 5/2015 | Tani et al. | |
| 9,065,253 B2 | 6/2015 | Anantram et al. | |
| 2007/0215859 A1* | 9/2007 | Clifton | H01L 29/1054 257/19 |
| 2008/0001182 A1* | 1/2008 | Chen | H01L 21/823807 257/255 |
| 2008/0205466 A1* | 8/2008 | Verma | H01S 5/22 372/45.011 |
| 2013/0039664 A1* | 2/2013 | Clifton | H01L 31/0352 398/200 |
| 2013/0294472 A1* | 11/2013 | Feng | H01S 5/0424 372/50.22 |
| 2015/0063382 A1 | 3/2015 | Capellini et al. | |

FOREIGN PATENT DOCUMENTS

| | | |
|---|---|---|
| WO | WO2011044226 A3 | 4/2011 |
| WO | WO2014002014 A2 | 9/2014 |
| WO | WO2014002014 A3 | 9/2014 |

OTHER PUBLICATIONS

Wu, L., et al., "The Effects of Selenium Doping on Performances of MOWE Grown Compressively Strained (Al)GaInP Lasers," IEEE Lasers and Electro-Optics Society 1999 12th Annual Meeting, vol. 2, Nov. 1999. (pp. 439-440).

* cited by examiner

TUNABLE SEMICONDUCTOR BAND GAP REDUCTION BY STRAINED SIDEWALL PASSIVATION

BACKGROUND

Technical Field

The present invention relates to semiconductor device sidewall passivation, and more particularly to devices and methods with passivizing materials formed on edges of active regions to induce strain.

Description of the Related Art

Mesa structures are commonly used structures employed to isolate active device layers in semiconductor devices, such as light emitting diodes (LEDs), lasers, certain transistors, etc. Mesa structures are usually a stack of layers having mesa sidewalls that have edges of active regions exposed. A simple mesa structure may include a substrate, a stack of active layers formed on the substrate and a top contact. The sidewalls are etched and typically remain exposed. The exposed sidewalls of the active layers include many unsatisfied bonds, which create a high density of deep-level trap states and can result in device performance being degraded.

SUMMARY

A semiconductor device includes a mesa structure having vertical sidewalls, the mesa structure including an active area comprising a portion of its height. A stressed passivation liner is formed on the vertical sidewalls of the mesa structure and over the portion of the active area. The stressed passivation liner induces strain in the active area to permit tuning of performance parameters of the mesa structure.

A semiconductor device includes a mesa structure having vertical sidewalls, the mesa structure including at least a substrate, an active area formed over the substrate and a cap or contact layer formed on the active area. The active area includes a portion of a height of the mesa structure. A stressed passivation liner is formed on the vertical sidewalls of the mesa structure and over the portion of the active area. The stressed passivation liner includes a semiconductor material configured to induce strain in the active area to permit tuning of performance parameters of the mesa structure.

A method for tuning a semiconductor device includes forming a mesa structure having vertical sidewalls, the mesa structure including an active area comprising a portion of its height; forming a stressed passivation liner on the vertical sidewalls of the mesa structure and over the portion of the active area; and inducing strain in the stressed passivation liner to permit tuning of performance parameters of the mesa structure.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
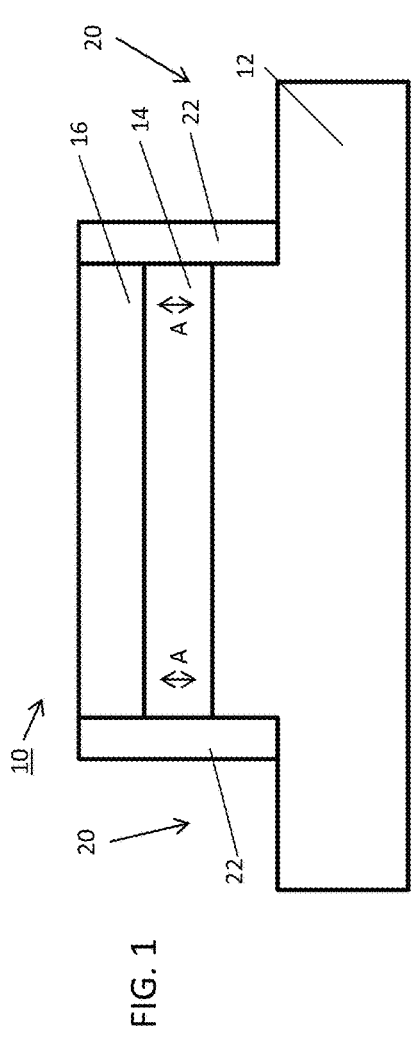
FIG. 1 is a cross-sectional view of a mesa structure having a liner for inducing strain to an active area of the mesa structure in accordance with the present principles.

In accordance with the present principles, mesa structures are provided with sidewall passivation that includes intentionally strained layers. A strained passivating liner may be employed to reduce trap density at edges of active regions to improve device performance. The strained active layer can also be tuned to adjust a band gap and a carrier mobility of the active region. The liner material may include an entirely crystalline material (e.g., an epitaxial semiconductor) or a partly amorphous material (e.g., a thin semiconductor passivation, thick strained dielectric).

In accordance with useful embodiments, the mesa structures in accordance with the present principles may be employed for light emitting diodes, lasers, bipolar transistors, sensors, etc. In one embodiment, the mesa structure may include an integrated circuit chip with active materials with different, tunable band gaps based upon the magnitude of the strained sidewall liners. In another embodiment, device operation wavelengths may be tuned by the strained sidewall liners. This may be employed in wavelength division multiplexing (WDM) applications. In other embodiments, biosensors may be employed with tuned wavelength sensing to light emission to excite dyes at specific wavelengths. Other applications are contemplated.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a mesa structure 10 is illustratively shown in accordance with one exemplary embodiment. Mesa structure 10 includes a substrate 12, a blanket deposited active region 14 and a cap or top contact layer 16. Other structures or layers may also be employed. For example, the substrate 12 may include a buffer layer, or one or more buffer layers may be formed on the substrate 12. In addition, contact layers may be provided on the substrate 12 or on a buffer layer formed on the substrate 12. The active layer(s) 14 may include n and p layers, junctions, intrinsic layers, quantum wells, charge conditioning layers, etc. The cap 16 may include a dielectric material or a conductive material (to form a contact). Other structures may also be formed on top of the cap layer 16, e.g., a lens, diffraction grating, additional conductive materials, etc.

The blanket deposited stack of the mesa structure 10 may have sidewalls etched to form recesses 20 to isolate the mesa structure 10 from adjacent devices (not shown). A liner 22 is formed on at least the exposed sidewalls of the active layers 14. The liner 22 is strained during formation or after formation. The amount of strain may be employed as a way of tuning the characteristics of a device formed by the mesa structure 10.

In one embodiment, the liner 22 includes a pseudomorphically strained semiconductor liner. A pseudomorphically strained material is strained but has the same in-plane lattice constant as the material it is formed on. The semiconductor liner 22 may be employed to passivate and strain the active layers 14 in a vertical direction as indicated by arrows "A". The pseudomorphically strained semiconductor liner (22) may include SiGe, GaN, InGaAs, GaAs, etc. depending on the materials of the mesa structure 10.

The liner 22 may be epitaxially deposited, although other deposition processes may be employed. The material of liner 22 may include a monocrystalline phase, a polycrystalline phase, or a partly amorphous phase. In one embodiment, the liner 22 may include a strained dielectric material, such as SiN or other dielectric material that can be employed to impart strain in a reliable manner. In one embodiment, a plurality of semiconductor layers may be employed for liner 22.

Figure 2:
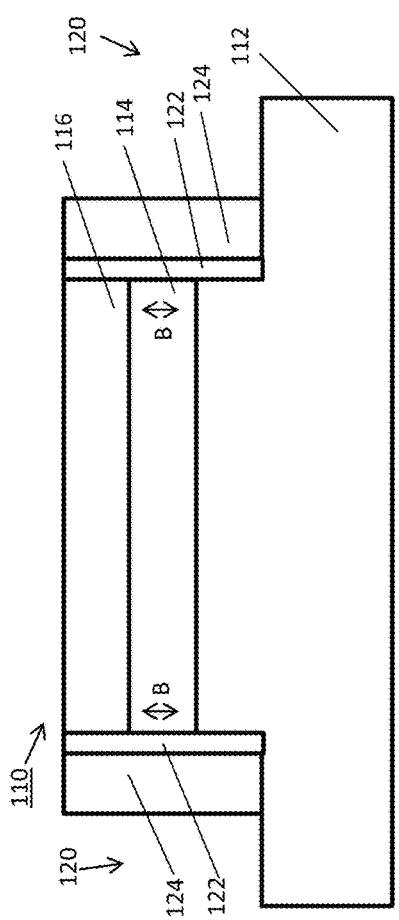
FIG. 2 is a cross-sectional view of a mesa structure having a dual layer liner for inducing strain to an active area of the mesa structure in accordance with the present principles.

Referring to FIG. 2, a mesa structure 110 is illustratively shown in accordance with another exemplary embodiment. Mesa structure 110 includes a substrate 112, a blanket deposited active region stack 114 and a cap or top contact layer 116. Other structures or layers may also be employed. For example, as before, the substrate 112 may include a buffer layer or one or more buffer layers may be formed on the substrate 112. In addition, contact layers may be provided on the substrate 112 or on a buffer layer formed on the substrate 112. The active layer(s) 114 may include n and p layers, junctions, intrinsic layers, quantum wells, charge conditioning layers, etc. The cap 116 may include a dielectric material or a conductive material (to form a contact). Other structures may also be formed on top of the cap layer 116, e.g., a lens, diffraction grating, additional conductive materials, etc.

The blanket deposited stack of the mesa structure 110 may have sidewalls etched to form recesses 120 to isolate the mesa structure 110 from adjacent devices (not shown). A liner 122 is formed on at least the exposed sidewalls of the active layers 114. The liner 122 is strained during formation or after formation. The amount of strain may be employed as a way of tuning the characteristics of a device formed by the mesa structure 110.

In one embodiment, the liner 122 may include a pseudomorphically strained semiconductor liner. The liner 122 includes a thin lattice-matched semiconductor used as passivation, followed by a thick high-tensile-strain dielectric liner 124 to strain the active layers in a vertical direction, as indicated by arrows "B". The liner 122 may be relatively thin as compared to the liner 124. The liner 122 may be formed in an unstrained state and be strained by the formation of the liner 124. Liner 124 may include a thicker, strained dielectric material. The semiconductor liners 122 and 124 may be employed to passivate and strain the active layers 114 in the vertical direction. The pseudomorphically strained semiconductor liner 122 may include SiGe, GaN, InGaAs, GaAs, etc. depending on the materials of the mesa structure 110. The liner 122 may be epitaxially deposited, although other deposition processes may be employed. The material of liner 122 may include a monocrystalline phase, a polycrystalline phase, or a partly amorphous phase.

The liner 124 is formed on the liner 122. The liner 124 may be deposited by an evaporation process or a chemical vapor deposition process (CVD). The liner 124 may develop strain based upon its thickness. Therefore, the liner 124 can be significantly thicker than the liner 122. As an example, the liner 122 may include a thickness of between about 5 nm and about 30 nm, and the liner 124 may include a thickness of between about 5 nm and about 100 nm (or more). In one embodiment, the liner 124 may include SiN or other dielectric material that can be employed to impart strain in a reliable manner.

Figure 3:
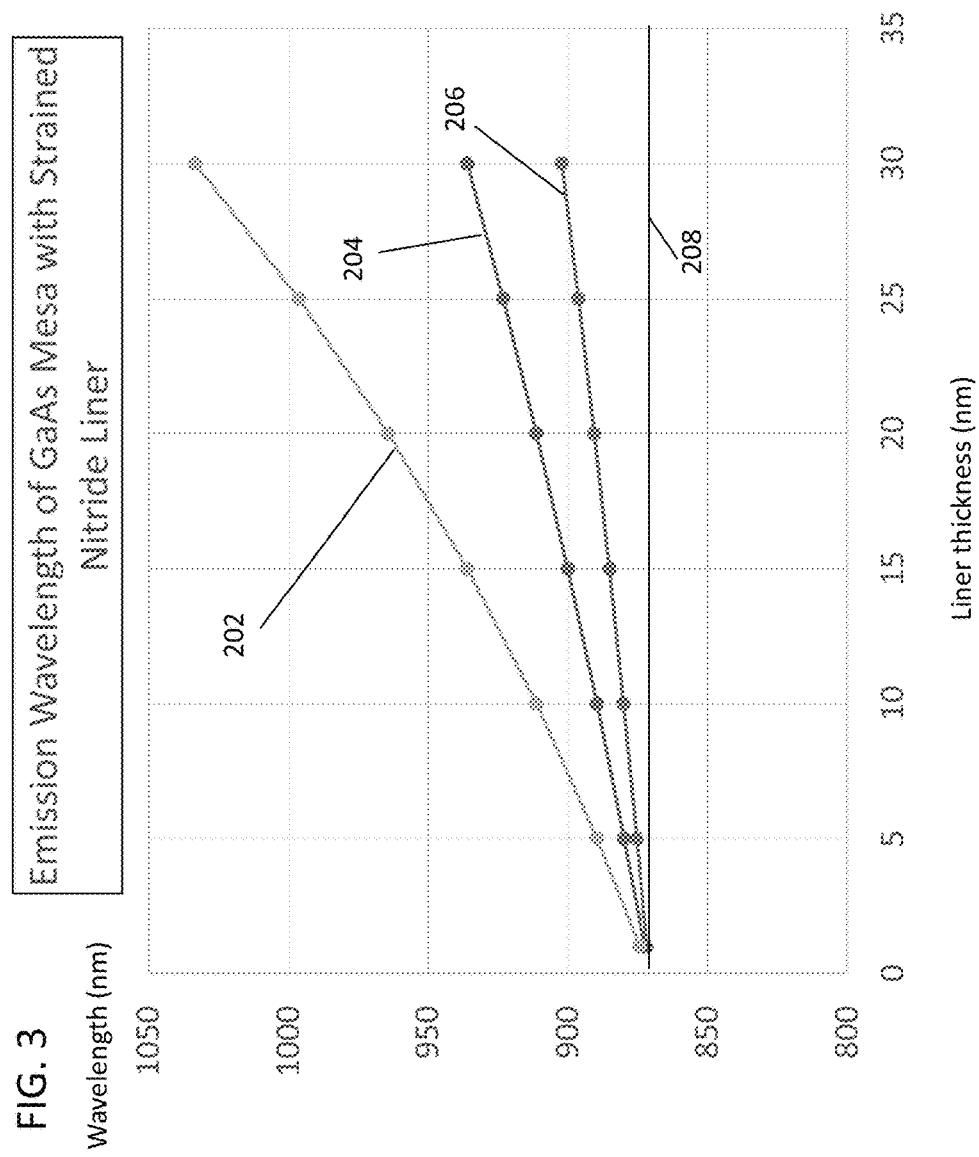
FIG. 3 is a graph showing wavelength (nm) versus liner thickness (nm) for different mesa structures and stress levels of the liner in accordance with the present principles.

Referring to FIG. 3, a plot of emission wavelength (nm) versus liner thickness (nm) is illustratively shown to indicate the ability to tune parameters of a GaAs mesa structure with a sidewall liner in accordance with the present principles. In this example, the sidewall liner includes a nitride (e.g., SiN) material. The mesa structure included a circular-shaped footprint and included a GaAs active region having a diameter of 100 nm or 200 nm.

Plot 202 shows a 100 nm diameter mesa active area with a nitride liner stressed to 2 GPa (compressive). The stress of the nitride liner induces a strain in the GaAs resulting in a change in the emission wavelength of the mesa device during operation. While wavelength is indicated in the diagram of FIG. 3, similar results are achieved for other parameters as well. For example, a band gap can be adjusted, carrier mobility may be adjusted, device performance (current, voltage, etc.) can be adjusted, etc.

Plot 204 shows a 200 nm diameter mesa active area with a nitride liner stressed to 2 GPa (compressive). The stress of the nitride liner induces a strain in the GaAs resulting in a change in the emission wavelength of the mesa device during operation. While the wavelength change is less, the change seems to behave more linearly making adjustment highly predictable. Similar results are achieved for other parameters as well, e.g., band gap, carrier mobility, etc. Compressive strain in the liner creates tensile strain in active layers of the mesa. In one example, for the 200 nm circular GaAs mesa with a high compressive stress silicon nitride liner, a tensile strain of 1% provided a band gap reduction of 100 meV and wavelength shift of about 65 nm.

Plot 206 shows a 200 nm diameter mesa active area with a nitride liner stressed to 1 GPa (compressive). The stress of the nitride liner induces a strain in the GaAs resulting in a change in the emission wavelength of the mesa device during operation. The wavelength change is less than for plot 204. Similar results are achieved for other parameters as well, e.g., band gap, carrier mobility, etc. A line 208 shows the emission wavelength of an unstrained GaAs mesa active area for comparison.

In accordance with the present principles, strained liners on mesa structures can provide adjustments to band gap, carrier mobility, performance, etc. In accordance with changes in at least stress/strain of the liner, thickness of the active region and materials.

Figure 4:
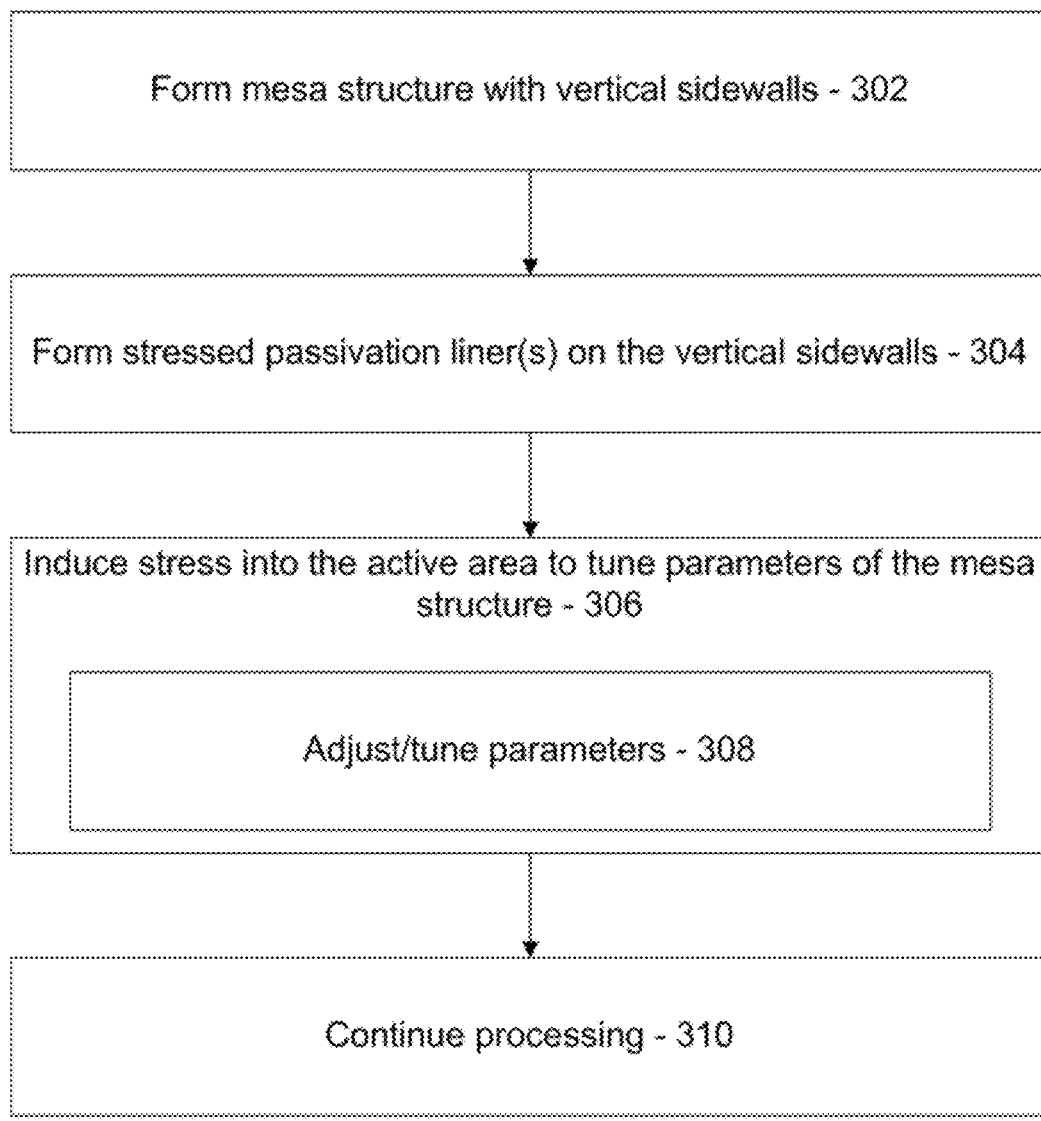
FIG. 4 is a block/flow diagram showing a method for tuning a semiconductor device in accordance with illustrative embodiments.

Referring to FIG. 4, a method for tuning a semiconductor device is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 302, a mesa structure is formed having vertical sidewalls. The mesa structure may include a stack of blanket deposited layers on a substrate. The layers are then lithographically patterned to etch the layers to create distance between neighboring devices. The etch process isolates each mesa and creates the vertical sidewalls with exposed active areas. The mesas may include any footprint shape, circle, square, rectangle, etc. The stack of layers may include buffer layers, contact layers, active layers, etc.

The active area comprises a portion of the height of the mesa. The height of the active area and/or the shape of the mesa as a whole may influence the stress/strain on the active layer(s) when strain is induced by a liner or liners as will be described. The mesa structure may include one of a diode, a laser, a transistor or any other suitable device.

In block 304, a stressed passivation liner is formed on the vertical sidewalls of the mesa structure which includes the edges of the active area. The formation process may include a selective deposition process that grows (e.g., epitaxially) a semiconductor material of the sidewalls. In other embodiments, a dielectric layer may be formed over the mesas and etched to remove the dielectric layer from horizontal surfaces. In still other embodiments, both a semiconductor layer and a dielectric layer are formed. Other formation processes are also contemplated. The stressed passivation liner may include a semiconductor material that is pseudomorphically grown on the mesa structure.

In block 306, strain (stress) is induced by the stressed passivation liner to permit tuning of performance parameters of the mesa structure. The strain may be induced during the formation process of the liner or after the liner has been formed.

In block 308, inducing strain may include adjusting one or more of emission wavelength, band gap and/or performance of the mesa structure. Other parameters may also be adjusted in this way. Adjustments may be made based on the thickness of the liner, the stress created upon formation, material properties, geometry (e.g., shape) of the mesa, etc.

In block 310, further processing may be carried out to complete the device. This may include the formation of contacts, reflectors, lenses or any other structures needed to complete the device.

Having described preferred embodiments for tunable semiconductor band gap adjustment by strained sidewall passivation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
   a mesa structure having vertical sidewalls, the mesa structure including an active area comprising a portion of its height;
   a stressed passivation liner pseudomorphically formed from the vertical sidewalls of the mesa structure; and
   a stressed dielectric layer formed on the stressed passivation liner, the stressed dielectric layer and the stressed passivation liner inducing strain in the active area to permit tuning of performance parameters of the mesa structure.

2. The semiconductor device as recited in claim 1, wherein the liner includes a semiconductor material.

3. The semiconductor device as recited in claim 1, wherein the liner is configured to adjust one or more of emission wavelength, band gap and/or performance of the mesa structure.

4. The semiconductor device as recited in claim 1, wherein the mesa structure includes one of a diode, a laser or a transistor.

5. A semiconductor device, comprising:
   a mesa structure having vertical sidewalls, the mesa structure including at least a substrate, an active area formed over the substrate and a cap or contact layer formed on the active area, the active are comprising a portion of a height of the mesa structure; and
   a stressed passivation liner formed from the vertical sidewalls of the mesa structure, the stressed passivation liner including a stressed dielectric layer and a semiconductor material configured to induce strain in the active area to permit tuning of performance parameters of the mesa structure.

6. The semiconductor device as recited in claim 5, wherein the semiconductor material is pseudomorphically grown on the mesa structure.

7. The semiconductor device as recited in claim 5, wherein the liner is configured to adjust one or more of emission wavelength, band gap and/or performance of the mesa structure.

8. The semiconductor device as recited in claim 5, wherein the mesa structure includes one of a diode, a laser or a transistor.

9. A method for tuning a semiconductor device, comprising:
   forming a mesa structure having vertical sidewalls, the mesa structure including an active area comprising a portion of its height;
   pseudomorphically growing a stressed passivation liner from the vertical sidewalls of the mesa structure; and
   inducing strain in the stressed passivation liner to permit tuning of performance parameters of the mesa structure by forming a stressed dielectric layer on the stressed passivation liner.

10. The method as recited in claim 9, wherein forming the stressed passivation liner includes growing a semiconductor material.

11. The method as recited in claim 9, wherein inducing strain includes adjusting one or more of emission wavelength, band gap and/or performance of the mesa structure.

12. The method as recited in claim 9, wherein inducing strain includes adjusting one of mesa geometry and/or a thickness of the liner.

13. The method as recited in claim 9, wherein the mesa structure includes one of a diode, a laser or a transistor.

* * * * *